(12) United States Patent
Kozuka et al.

(10) Patent No.: US 7,405,160 B2
(45) Date of Patent: Jul. 29, 2008

(54) METHOD OF MAKING SEMICONDUCTOR DEVICE

(75) Inventors: Shinichi Kozuka, Nirasaki (JP); Naoto Umehara, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 28 days.

(21) Appl. No.: 11/299,690

(22) Filed: Dec. 13, 2005

(65) Prior Publication Data
US 2007/0134938 A1 Jun. 14, 2007

(51) Int. Cl.
*H01L 21/302* (2006.01)

(52) U.S. Cl. ............... 438/709; 438/710; 438/706; 438/E21.252; 438/E21.253

(58) Field of Classification Search ......... 438/706–710, 438/689
See application file for complete search history.

(56) References Cited

U.S. PATENT DOCUMENTS

2004/0007561 A1 * 1/2004 Nallan et al. ............... 216/67
2007/0077767 A1 * 4/2007 Jin et al. .................... 438/710

FOREIGN PATENT DOCUMENTS

JP 2005-39015 2/2005

* cited by examiner

*Primary Examiner*—Dung A. Le
(74) *Attorney, Agent, or Firm*—Oblon, Spivak, McClelland, Maier & Neustadt, P.C.

(57) ABSTRACT

A plasma processing method, which enables the etching controllability for a high-dielectric-constant insulating film to be improved. A substrate having a high-dielectric-constant gate insulating film and a hard mask formed thereon is subjected to etching processing using a plasma of a processing gas containing a noble gas and a reducing gas.

6 Claims, 5 Drawing Sheets

METHOD OF MAKING SEMICONDUCTOR DEVICE

BACKGROUND OF THE INVENTION

1. Field of the Invention

The present invention relates to a plasma processing method, a storage medium, and a plasma processing apparatus, and in particular relates to a plasma processing method that carries out etching processing on a high-dielectric-constant insulating film formed on a substrate.

2. Description of the Related Art

As semiconductor devices manufactured from semiconductor wafers as substrates are made smaller in size and with an increased degree of integration, there are increased demands to make gate insulating films of transistors and dielectric portions of capacitors (i.e. insulating films) of the semiconductor devices thinner. An insulating film satisfying these demands for thinness is only a few atoms thick, and in this case, with the conventional insulating film material $SiO_2$, current leakage through the insulating film due to a quantum tunneling effect increases. It is thus difficult to use $SiO_2$ as the material of such a thin insulating film.

In response to this problem, high-dielectric-constant insulating film materials according to which there is no current leakage even if a large current is passed have been developed. Such high-dielectric-constant insulating film materials are metal-based materials; specifically, an oxide of hafnium (Hf) or zirconium (Zr), or such an oxide with silicon (Si) additionally contained therein, or an oxide of aluminum (Al), or the like, can be used. However, there is a problem with these high-dielectric-constant insulating film materials that, in the case that etching is carried out using a plasma of a fluorine gas-based mixed gas as conventionally used in the etching of $SiO_2$, the etching rate is slow.

A metal-based insulating film can be etched with a high etching rate using chemical etching comprised of a combination of corrosion with a corrosive gas and high temperature processing, but there are many problems, for example to carry out such chemical etching, a corrosion processing chamber and a high temperature processing chamber are both required, and hence a new system construction is required, and the cost of the system increases.

In recent years, there has thus been developed a plasma processing method in which a high-dielectric-constant gate insulating film is etched using a conventional etching apparatus with a plasma of a mixed gas comprised of argon (Ar), helium (He), or a mixed gas of argon and helium, with methane ($CH_4$) added thereto (a noble gas-based mixed gas) (see Japanese Laid-open Patent Publication (Kokai) No. 2005-39015).

However, with a low sputter etching apparatus, even if a plasma of such a noble gas-based mixed gas is used, the etching rate is still slow, i.e. the required etching rate cannot be realized. Moreover, with a high sputter etching apparatus, the etching rate is sufficiently high, and hence the required etching rate can be realized, but silicon nitride (SiN), which is the material of a hard mask, is also etched with a high etching rate, and hence it is difficult to secure a good (high) etching selectivity ratio for the high-dielectric-constant insulating film versus the hard mask. That is, there is a problem that the etching controllability for the high-dielectric-constant insulating film is still low.

SUMMARY OF THE INVENTION

It is an object of the present invention to provide a plasma processing method, a storage medium, and a plasma processing apparatus, enabling the etching controllability for a high-dielectric-constant insulating film to be improved.

To attain the above object, in a first aspect of the present invention, there is provided a plasma processing method comprising subjecting a substrate having a high-dielectric-constant gate insulating film and a hard mask formed thereon to etching processing using a plasma of a processing gas, wherein the processing gas contains a noble gas and a reducing gas.

According to the first aspect as described above, a substrate having a high-dielectric-constant gate insulating film and a hard mask formed thereon is subjected to etching processing using a plasma of a processing gas containing a noble gas and a reducing gas. As a result, even though a plasma of the noble gas physically etches not only the high-dielectric-constant insulating film but also the hard mask, a plasma of the reducing gas reduces the etching rate for the physical etching of the hard mask by the plasma of the noble gas. Even in the case of a high sputter etching apparatus, a good etching selectivity ratio for the high-dielectric-constant gate insulating film versus the hard mask can thus be secured, whereby the etching controllability for the high-dielectric-constant gate insulating film can be improved.

Preferably, the noble gas comprises at least one selected from the group consisting of helium gas, neon gas, argon gas, krypton gas, and xenon gas.

According to the first aspect as described above, the noble gas comprises at least one selected from the group consisting of helium gas, neon gas, argon gas, krypton gas, and xenon gas. As a result, the noble gas can easily be procured, and hence the etching processing can be carried out easily.

Preferably, the reducing gas comprises at least one selected from the group consisting of hydrogen gas, carbon monoxide gas, and methane gas.

According to the first aspect as described above, the reducing gas comprises at least one selected from the group consisting of hydrogen gas, carbon monoxide gas, and methane gas. As a result, the reducing gas can easily be procured, and hence the etching processing can be carried out easily.

Preferably, the processing gas contains at least xenon gas and hydrogen gas.

According to the first aspect as described above, the processing gas contains at least xenon gas and hydrogen gas. Even though a plasma of the xenon physically etches not only the high-dielectric-constant insulating film but also the hard mask, a plasma of the hydrogen inhibits this etching by physical sputtering. The plasma of the hydrogen thus reduces the etching rate for the physical etching of the hard mask by the plasma of the xenon. Even in the case of a high sputter etching apparatus, a good etching selectivity ratio for the high-dielectric-constant gate insulating film versus the hard mask can thus be secured reliably, whereby the etching controllability for the high-dielectric-constant gate insulating film can be reliably improved.

More preferably, the processing gas further contains argon gas.

According to the first aspect as described above, the processing gas further contains argon gas. As a result, even though a plasma of the argon also physically etches not only the high-dielectric-constant insulating film but also the hard mask, the plasma of the hydrogen inhibits this etching by physical sputtering. The plasma of the hydrogen thus reduces the etching rate for the physical etching of the hard mask by the plasma of the argon. Even in the case of a high sputter etching apparatus, a good etching selectivity ratio for the high-dielectric-constant gate insulating film versus the hard mask can thus be secured reliably, while realizing a high etching rate for the high-dielectric-constant gate insulating film.

To attain the above object, in a second aspect of the present invention, there is provided a plasma processing method comprising subjecting a substrate having a high-dielectric-constant insulating film constituting dielectric portions of capacitors formed thereon to etching processing using a plasma of a processing gas, wherein the processing gas contains a halogen gas, a noble gas and a reducing gas.

According to the second aspect as described above, a substrate having a high-dielectric-constant insulating film constituting dielectric portions of capacitors formed thereon is subjected to plasma processing using a plasma of a processing gas containing a halogen gas, a noble gas and a reducing gas. The noble gas promotes dissociation of the halogen gas to produce the halogen, and hence etching of the high-dielectric-constant insulating film by the halogen produced is promoted. Moreover, the reducing gas reduces the halogen compound. As a result, even in the case of a low sputter etching apparatus, the required etching rate can be realized, whereby the etching controllability for the high-dielectric-constant insulating film can be improved.

Preferably, the noble gas comprises at least one selected from the group consisting of helium gas, neon gas, argon gas, krypton gas, and xenon gas.

Preferably, the reducing gas comprises at least one selected from the group consisting of hydrogen gas, carbon monoxide gas, and methane gas.

Preferably, the halogen gas is a gas of at least one compound containing at least one selected from the group consisting of fluorine, chlorine, and bromine.

According to the second aspect as described above, the halogen gas is a gas of at least one compound containing at least one selected from the group consisting of fluorine, chlorine, and bromine. As a result, the halogen gas (the gas of the compound) can easily be procured, and hence the etching processing can be carried out easily.

Preferably, the processing gas contains at least a fluorine compound gas, carbon monoxide gas and xenon gas.

According to the second aspect as described above, the processing gas contains at least a fluorine compound gas, carbon monoxide gas and xenon gas. The xenon gas promotes dissociation of the fluorine compound to produce fluorine, and hence efficient etching of the high-dielectric-constant insulating film by the fluorine produced is realized. Moreover, the carbon monoxide reduces the fluorine from the fluorine compound. As a result, even in the case of a low sputter etching apparatus, the required etching rate can be realized reliably, whereby the etching controllability for the high-dielectric-constant insulating film can be reliably improved.

To attain the above object, in a third aspect of the present invention, there is provided a computer-readable storage medium storing a program for causing a computer to implement a plasma processing method of subjecting a substrate having a high-dielectric-constant gate insulating film and a hard mask formed thereon to etching processing using a plasma of a processing gas, wherein the processing gas contains a noble gas and a reducing gas.

To attain the above object, in a fourth aspect of the present invention, there is provided a computer-readable storage medium storing a program for causing a computer to implement a plasma processing method of subjecting a substrate having a high-dielectric-constant insulating film constituting dielectric portions of capacitors formed thereon to etching processing using a plasma of a processing gas, wherein the processing gas contains a halogen gas, a noble gas and a reducing gas.

To attain the above object, in a fifth aspect of the present invention, there is provided a plasma processing apparatus that subjects a substrate having a high-dielectric-constant gate insulating film and a hard mask formed thereon to etching processing using a plasma of a processing gas, wherein the processing gas contains a noble gas and a reducing gas.

To attain the above object, in a sixth aspect of the present invention, there is provided a plasma processing apparatus that subjects a substrate having a high-dielectric-constant insulating film constituting dielectric portions of capacitors formed thereon to etching processing using a plasma of a processing gas, wherein the processing gas contains a halogen gas, a noble gas and a reducing gas.

The above and other objects, features, and advantages of the invention will become more apparent from the following detailed description taken in conjunction with the accompanying drawings.

BRIEF DESCRIPTION OF THE DRAWINGS

FIG. 3A is a sectional view showing the surface form when xenon gas is not added; and FIG. 3B is a sectional view showing the surface form when 120 sccm of xenon gas is added;

DETAILED DESCRIPTION OF THE PREFERRED EMBODIMENTS

The present inventors carried out assiduous studies to attain the above object, and as a result discovered that in the case of subjecting a substrate having a high-dielectric-constant gate insulating film and a hard mask formed thereon to etching processing using a plasma of a processing gas, if the processing gas contains a noble gas and a reducing gas, preferably at least xenon gas and hydrogen gas, then a plasma of the hydrogen causes a reduction in the etching rate for physical etching of the hard mask by a plasma of the xenon, and hence even in the case of a high sputter etching apparatus, a good etching selectivity ratio for the high-dielectric-constant gate insulating film versus the hard mask can be secured reliably, whereby the etching controllability for the high-dielectric-constant gate insulating film can be reliably improved.

Moreover, the present inventors carried out further assiduous studies to attain the above object, and as a result discovered that in the case of subjecting a substrate having a high-dielectric-constant insulating film formed thereon as dielectric portions of capacitors to etching processing using a plasma of a processing gas, if the processing gas contains a halogen gas, a noble gas and a reducing gas, preferably at least a fluorine compound gas, carbon monoxide gas and xenon gas, then the xenon gas promotes dissociation of the fluorine compound to produce fluorine, whereby efficient etching of the high-dielectric-constant insulating film by the fluorine produced is realized, and moreover the carbon monoxide reduces the fluorine compound. Even in the case of a low sputter etching apparatus, the required etching rate can thus be realized, whereby the etching controllability for the high-dielectric-constant insulating film can be reliably improved.

The present invention was achieved based on the above findings.

The present invention will now be described in detail with reference to the drawings showing preferred embodiments thereof. First, a plasma processing method according to a first embodiment of the present invention will be described.

Figure 1:
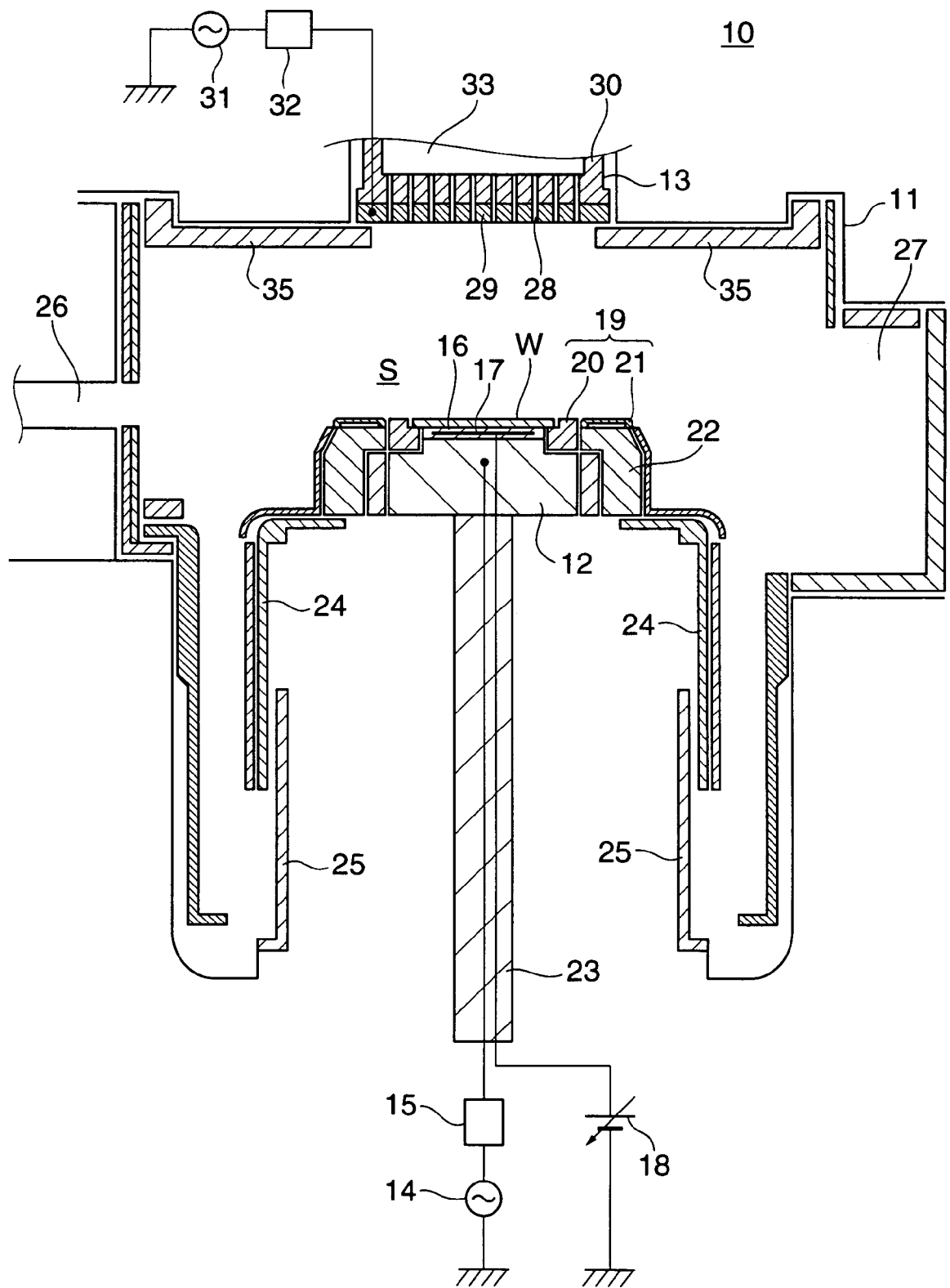
FIG. 1 is a sectional view schematically showing the construction of a plasma processing apparatus to which is applied a plasma processing method according to a first embodiment of the present invention.

FIG. 1 is a sectional view schematically showing the construction of a plasma processing apparatus to which is applied a plasma processing method according to a first embodiment of the present invention. This plasma processing apparatus is constructed as an etching processing apparatus that carries out low sputter etching processing on a high-dielectric-constant insulating film that constitutes dielectric portions of capacitors formed on semiconductor devices on a wafer W. Here, the high-dielectric-constant insulating film is made of hafnium oxide.

As shown in FIG. 1, the plasma processing apparatus 10 has a chamber 11 (processing chamber) made of a metal such as aluminum or stainless steel. In the chamber 11 are disposed a lower electrode 12 as a stage that has mounted thereon a wafer W having a diameter of, for example, 300 mm, and can be raised and lowered in the chamber 11 together with the wafer W mounted thereon, and a shower head 13 that is disposed in a ceiling portion of the chamber 11 facing the lower electrode 12 and supplies a processing gas, described below, into the chamber 11.

A lower high-frequency power source 14 is connected to the lower electrode 12 via a lower matcher 15. The lower high-frequency power source 14 applies predetermined high-frequency electrical power to the lower electrode 12. The lower matcher 15 reduces reflection of the high-frequency electrical power from the lower electrode 12 so as to maximize the efficiency of input of the high-frequency electrical power into the lower electrode 12.

An electrostatic chuck (hereinafter referred to as "ESC") 16 for attracting the wafer W by electrostatic attraction is disposed in an upper portion of the lower electrode 12. The ESC 16 has built therein an ESC electrode plate 17 formed as an electrode film laminate. The ESC electrode plate 17 has a DC power source 18 electrically connected thereto. The wafer W is attracted to and held on an upper surface of the ESC 16 through a Johnsen-Rahbek force or a Coulomb force produced by a DC voltage applied to the ESC electrode plate 17 from the DC power source 18.

An annular focus ring 19 is disposed around the wafer W mounted on the ESC 16 so as to surround an outer periphery of the wafer W. The focus ring 19 is comprised of an annular inner focus ring member 20 that is disposed so as to surround the outer periphery of the mounted wafer W, and an annular outer focus ring member 21 that is disposed so as to surround an outer periphery of the inner focus ring member 20. The inner focus ring member 20 is mounted on the lower electrode 12, and the outer focus ring member 21 is mounted on an ESC covering member 22 that is disposed so as to surround the lower electrode 12. The inner focus ring member 20 is made of a conductive material such as silicon, and the outer focus ring member 21 is made of an insulating material such as quartz. The inner focus ring member 20 focuses onto the wafer W a plasma that is produced from the processing gas, described below, in a processing space S between the lower electrode 12 and the shower head 13. The outer focus ring member 21 functions as an insulator that confines the plasma to the vicinity of the wafer W.

A support 23 provided so as to extend from a lower portion of the lower electrode 12 downward is disposed below the lower electrode 12. The support 23 supports the lower electrode 12. The lower electrode 12 is raised and lowered by rotating a ball screw, not shown. Moreover, the support 23 is surrounded by covers 24 and 25 so as to be cut off from the atmosphere in the chamber 11.

A transfer port 26 for the wafers W and an exhaust port 27 are provided in a side wall of the chamber 11. Each wafer W is transferred in and out of the chamber 11 via the transfer port 26 by a transfer arm (not shown) of an LLM (load lock module) (not shown) disposed adjacent to the plasma processing apparatus 10. The exhaust port 27 is connected to an exhaust system comprised of devices (not shown) such as an APC (automatic pressure control) valve, a DP (dry pump), and a TMP (turbo molecular pump), whereby air or the like is discharged out of the chamber 11.

According to the plasma processing apparatus 10, when a wafer W is to be transferred into the chamber 11, the lower electrode 12 is lowered down to the same height as the transfer port 26, and when the wafer W is to be subjected to the plasma processing, the lower electrode 12 is raised up to a wafer W processing position. In FIG. 1, the positional relationship between the transfer port 26 and the lower electrode 12 just after a wafer W has been transferred into the chamber 11 is shown.

The shower head 13 has a disk-shaped upper electrode plate 29 that faces onto the processing space S and has therein a large number of gas-passing holes 28, and an electrode plate support 30 that is disposed above the upper electrode plate 29 and from which the upper electrode plate 29 is detachably hung. An outer peripheral portion of a surface of the upper electrode plate 29 facing onto the processing space S is covered by an inner peripheral portion of a shield ring 35, which is an annular member disposed in the ceiling portion of the chamber 11. The shield ring 35 is made of, for example, quartz, and protects from the plasma screws (not shown) that are disposed around the outer periphery of the upper electrode plate 29 and are used to fix the upper electrode plate 29 into the ceiling portion of the chamber 11.

An upper high-frequency power source 31 is connected to the upper electrode plate 29 via an upper matcher 32. The upper high-frequency power source 31 applies predetermined high-frequency electrical power to the upper electrode plate 29. The upper matcher 32 reduces reflection of the high-frequency electrical power from the upper electrode plate 29 so as to maximize the efficiency of input of the high-frequency electrical power into the upper electrode plate 29.

A buffer chamber 33 is provided inside the electrode plate support 30, and a processing gas introducing pipe (not shown)

is connected to the buffer chamber 33. A processing gas comprised of a mixture of $C_4F_8$ gas, carbon monoxide gas, argon gas and xenon gas in predetermined flow rate proportions is introduced from the processing gas introducing pipe into the buffer chamber 33, and is then supplied into the processing space S via the gas-passing holes 28.

In the chamber 11 of the plasma processing apparatus 10, high-frequency electrical power is applied to the lower electrode 12 and the upper electrode plate 29 as described above, whereby a high-density plasma is produced from the processing gas in the processing space S. The plasma etches the high-dielectric-constant insulating film (hafnium oxide film) formed on the semiconductor devices on the wafer W.

Here, as described above, such a high-dielectric-constant insulating film can be etched by a plasma of a noble gas-based mixed gas, e.g. a mixed gas containing argon gas, but in this case, with a low sputter etching apparatus, the sputtering power of the argon plasma is low, and hence the etching rate is low, i.e. the required etching rate cannot be realized. Moreover, depending on the application, the high-dielectric-constant insulating film may be formed on an $SiO_2$ layer, and with a low sputter etching apparatus, residue of the high-dielectric-constant insulating film arises on the $SiO_2$ layer. The residue of the high-dielectric-constant insulating film acts as a mask when etching the $SiO_2$ layer, and hence needle-like projections are formed on the $SiO_2$ layer. That is, a smooth $SiO_2$ layer surface cannot be formed.

In view of this, according to the plasma processing method of the present embodiment, the high-dielectric-constant insulating film is etched with a plasma of a processing gas comprised of a mixture of $C_4F_8$ gas, carbon monoxide gas, argon gas and xenon gas in predetermined flow rate proportions. In this case, the carbon monoxide reduces fluorine from the $C_4F_8$, and the argon and xenon promote dissociation of the $C_4F_8$ to produce fluorine. Here, because the halogen compound dissociating power of xenon is greater than that of argon, the xenon promotes dissociation of the $C_4F_8$ to produce fluorine more, whereby etching of the high-dielectric-constant insulating film by the fluorine produced is promoted. According to the plasma processing method of the present embodiment, the high-dielectric-constant insulating film can thus be etched with a higher etching rate than for etching of a high-dielectric-constant insulating film by a plasma of argon alone.

According to the plasma processing method of the present embodiment, a wafer W having a high-dielectric-constant insulating film formed thereon as dielectric portions of capacitors formed on semiconductor devices is subjected to etching processing using a plasma of a processing gas comprised of a mixture of $C_4F_8$ gas, carbon monoxide gas, argon gas and xenon gas in predetermined flow rate proportions. As a result, the high-dielectric-constant insulating film can be etched with a higher etching rate than for etching of a high-dielectric-constant insulating film by a plasma of argon alone, and hence even in the case of a low sputter etching apparatus, the required etching rate can be reliably realized, whereby the etching controllability for the high-dielectric-constant insulating film can be reliably improved.

Moreover, according to the plasma processing method of the present embodiment, because the high-dielectric-constant insulating film can be etched with a high etching rate, residue of the high-dielectric-constant insulating film can be prevented from arising. As a result, the formation of needle-like projections on an $SiO_2$ layer can be inhibited, and hence a smooth $SiO_2$ layer surface can be formed.

According to the plasma processing method of the present embodiment described above, a mixed gas of $C_4F_8$ gas, carbon monoxide gas, argon gas and xenon gas is used, but there is no limitation thereto. For example, in the above mixed gas, argon gas and xenon gas are included as a noble gas, but the included noble gas may instead be comprised of one selected from helium gas, neon gas, argon gas, krypton gas and xenon gas, or a combination of a plurality selected from these gases. Moreover, carbon monoxide gas is included as a reducing gas in the above mixed gas, but the included reducing gas may instead be hydrogen gas or methane gas, or may be comprised of a combination of a plurality selected from hydrogen gas, carbon monoxide gas and methane gas. Furthermore, $C_4F_8$ gas is included as a halogen compound gas in the above mixed gas, but the included halogen compound gas may instead be one selected from other fluorine compound gases, chlorine compound gases, and bromine compound gases, or may be comprised of a combination of a plurality selected from these gases. All of the above gases can easily be procured, and hence the etching processing can be carried out easily.

Moreover, in the plasma processing method according to the present embodiment, the high-dielectric-constant insulating film subjected to the etching is a hafnium oxide film. However, there is no limitation thereto, but rather the high-dielectric-constant insulating film may be a zirconium oxide film or an aluminum oxide film.

Next, a plasma processing method according to a second embodiment of the present invention will be described.

The present embodiment is basically the same as the above first embodiment in terms of construction and operation, but differs from the first embodiment in that a transistor high-dielectric-constant gate insulating film and a hard mask (silicon nitride film) are formed on semiconductor devices on a wafer W subjected to the etching processing, and moreover the plasma processing apparatus is constructed as an etching processing apparatus that carries out high sputter etching processing on the high-dielectric-constant gate insulating film; the constitution of the processing gas also differs to in the first embodiment. Description of features of the construction and operation that are the same as in the first embodiment will thus be omitted here, with only features of the construction and operation that are different to in the first embodiment being described.

In the plasma processing method according to the present embodiment, a processing gas comprised of a mixture of argon gas, xenon gas and hydrogen gas in predetermined flow rate proportions is introduced from the processing gas introducing pipe into the buffer chamber 33 in the electrode plate support 30, and is then supplied into the processing space S via the gas-passing holes 28. A high-density plasma is produced from the processing gas supplied into the processing space S by applied high-frequency electrical power, and the plasma etches the high-dielectric-constant gate insulating film (hafnium oxide) formed on the semiconductor devices on the wafer W.

Such a high-dielectric-constant gate insulating film can be etched by a plasma of a noble gas-based mixed gas, e.g. a mixed gas containing argon gas and xenon gas. In this case, with a high sputter etching apparatus, the etching rate is sufficiently high, i.e. the required etching rate can be realized, but silicon nitride, which is the material of the hard mask, is also etched with a high etching rate.

In view of this, according to the plasma processing method of the present embodiment, the high-dielectric-constant gate insulating film is etched with a plasma of a processing gas comprised of a mixture of argon gas, xenon gas and hydrogen gas in predetermined flow rate proportions. In this case, a plasma of the argon and a plasma of the xenon physically etch the high-dielectric-constant gate insulating film and the hard mask. A plasma of the hydrogen inhibits this etching by physical sputtering. The plasma of the hydrogen thus reduces the etching rate for the etching of-the high-dielectric-constant gate insulating film and the hard mask by the plasma of the argon and the plasma of the xenon. The extent of the decrease in the etching rate with the amount of hydrogen gas added is approximately the same for the high-dielectric-constant gate insulating film and the hard mask, but the etching rate for the hard mask is originally lower than the etching rate for the high-dielectric-constant gate insulating film, and hence upon adding a certain amount of hydrogen gas, the etching of the hard mask is stopped. The etching selectivity ratio for the high-dielectric-constant gate insulating film versus the hard mask is represented by (etching rate for high-dielectric-constant gate insulating film)/(etching rate for hard mask), and hence if the etching of the hard mask is stopped, then this etching selectivity ratio becomes infinitely large. According to the plasma processing method of the present embodiment, a good etching selectivity ratio for the high-dielectric-constant gate insulating film versus the hard mask is thus secured.

According to the plasma processing method of the present embodiment, a wafer W on which a transistor high-dielectric-constant gate insulating film and a hard mask are formed on semiconductor devices is etched using a plasma of a processing gas comprised of a mixture of argon gas, xenon gas and hydrogen gas in predetermined flow rate proportions. As a result, even in the case of a high sputter etching apparatus, a good etching selectivity ratio for the high-dielectric-constant gate insulating film versus the hard mask can be secured, whereby the etching controllability for the high-dielectric-constant gate insulating film can be improved.

According to the plasma processing method of the present embodiment described above, a mixed gas of argon gas, xenon gas and hydrogen gas is used, but there is no limitation thereto. For example, in the above mixed gas, argon gas and xenon gas are included as a noble gas, but the included noble gas may instead be comprised of one selected from helium gas, neon gas, argon gas, krypton gas and xenon gas, or a combination of a plurality selected from these gases. Moreover, hydrogen gas is included as a reducing gas in the above mixed gas, but the included reducing gas may instead be carbon monoxide gas or methane gas, or may be comprised of a combination of a plurality selected from hydrogen gas, carbon monoxide gas and methane gas. All of the above gases can easily be procured, and hence the etching processing can be carried out easily.

Moreover, in the plasma processing method according to the present embodiment, the high-dielectric-constant gate insulating film subjected to the etching is a hafnium oxide film. However, there is no limitation thereto, but rather the high-dielectric-constant gate insulating film subjected to the etching may be a zirconium oxide film or an aluminum oxide film.

It is to be understood that the object of the present invention can also be attained by supplying to a computer a storage medium storing program code of software that realizes the functions of an embodiment as described above, and then causing a CPU of the computer to read out and execute the program code stored in the storage medium.

In this case, the program code itself read out from the storage medium realizes the functions of the embodiment, and hence the program code and the storage medium storing the program code constitute the present invention.

The storage medium for supplying the program code may be any storage medium able to store the program code, for example, a RAM, an NV-RAM, a floppy (registered trademark) disk, a hard disk, a magnetic-optical disk, an optical disk such as a CD-ROM, a CD-R, a CD-RW, or a DVD (DVD-ROM, DVD-RAM, DVD-RW, or DVD+RW), a magnetic tape, a nonvolatile memory card, or another ROM. Alternatively, the program code may be supplied to the computer by being downloaded from another computer, a database or the like, not shown, connected to an internet, a commercial network, a local area network or the like.

Moreover, it is to be understood that the functions of the embodiment can be realized not only by executing program code read out by the computer, but also by causing an OS (operating system) or the like operating on the CPU to perform part or all of the actual processing based on instructions of the program code.

Furthermore, it is to be understood that the functions of the embodiment can also be realized by writing the program code read out from the storage medium into a memory provided on an expansion board inserted into the computer or in an expansion unit connected to the computer, and then causing a CPU or the like provided on the expansion board or in the expansion unit to perform part or all of the actual processing based on instructions of the program code.

The form of the program code may be, for example, object code, program code executed by an interpreter, or script data supplied to an OS.

EXAMPLES

Examples of the present invention will now be described in detail.

Example 1

First, a hafnium oxide film blanket wafer (a wafer having a hafnium oxide film formed on a surface thereof in the form of a blanket) was prepared as a wafer to be etched. Next, the blanket wafer was transferred into the chamber 11 of the plasma processing apparatus 10, and a mixture of $C_4F_8$ gas, carbon monoxide gas, argon gas and xenon gas at flow rates of 27, 300, 540 and 60 sccm respectively was supplied into the processing space S in the chamber 11 as a processing gas. The amount added of xenon relative to the total amount of noble gas was thus 10% in terms of the flow rate ratio. Next, high-frequency electrical power was applied into the processing space S, thus producing a plasma from the processing gas supplied, and hence etching the blanket wafer. The etching rate was measured during the etching. The measured etching rate is shown on a graph in FIG. 2.

Example 2

First, a hafnium oxide film blanket wafer was prepared as in Example 1. Next, the blanket wafer was etched using the same method as in Example 1. Here, a mixture of $C_4F_8$ gas, carbon monoxide gas, argon gas and xenon gas at flow rates of 27, 300, 480 and 120 sccm respectively was supplied into the processing space S. The amount added of xenon relative to the total amount of noble gas was thus 20% in terms of the flow rate ratio. The measured etching rate is shown on the graph in FIG. 2.

Figure 3A:
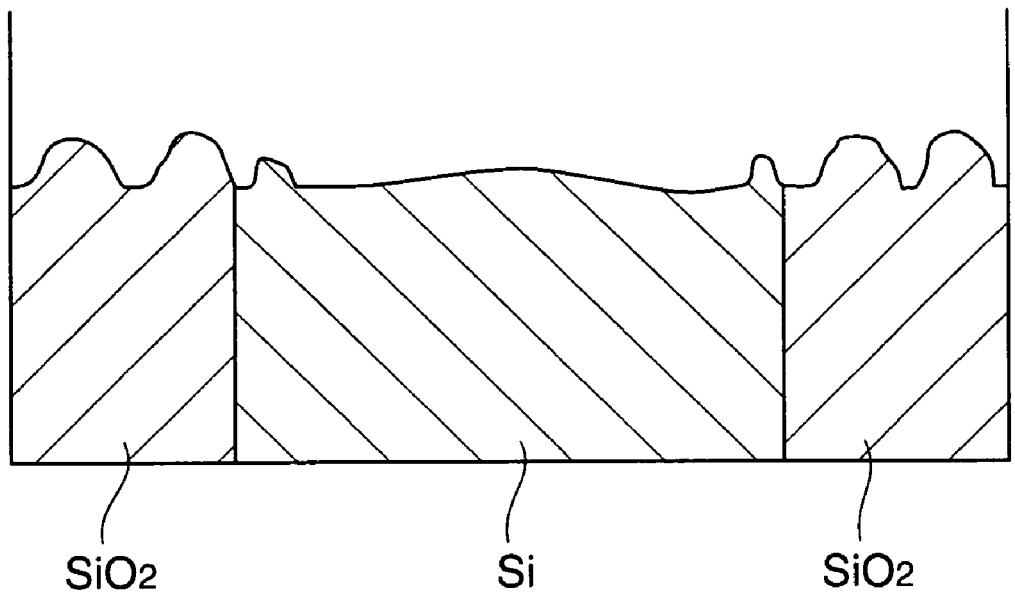
FIGS. 3A and 3B are sectional views showing the surface form of a wafer having a hafnium oxide film formed on an Si layer either directly or with an $SiO_2$ layer therebetween upon etching the wafer with a processing gas comprised of $C_4F_8$ gas, carbon monoxide gas and argon gas; specifically.
Figure 3B:
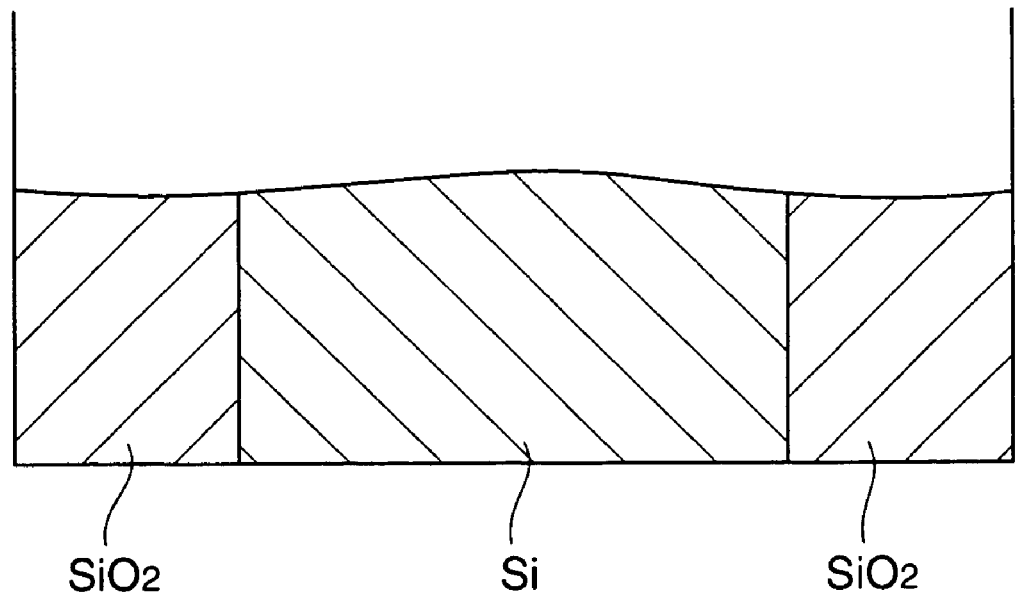

Moreover, a wafer having a hafnium oxide film formed on an Si layer either directly or with an $SiO_2$ layer therebetween was etched under the same etching conditions as stated above for this example, and the surface form of the etched wafer was measured. A sectional view of the measured form is shown in FIG. 3B.

Comparative Example 1

First, a hafnium oxide film blanket wafer was prepared as in Example 1. Next, the blanket wafer was etched using the same method as in Example 1. Here, a mixture of $C_4F_8$ gas, carbon monoxide gas and argon gas at flow rates of 27, 300 and 600 sccm respectively was supplied into the processing space S. The measured etching rate is shown on the graph in FIG. 2.

Moreover, a wafer having a hafnium oxide film formed on an Si layer either directly or with an $SiO_2$ layer therebetween was etched under the same etching conditions as stated above for this comparative example, and the surface form of the etched wafer was measured. A sectional view of the measured form is shown in FIG. 3A.

Figure 2:
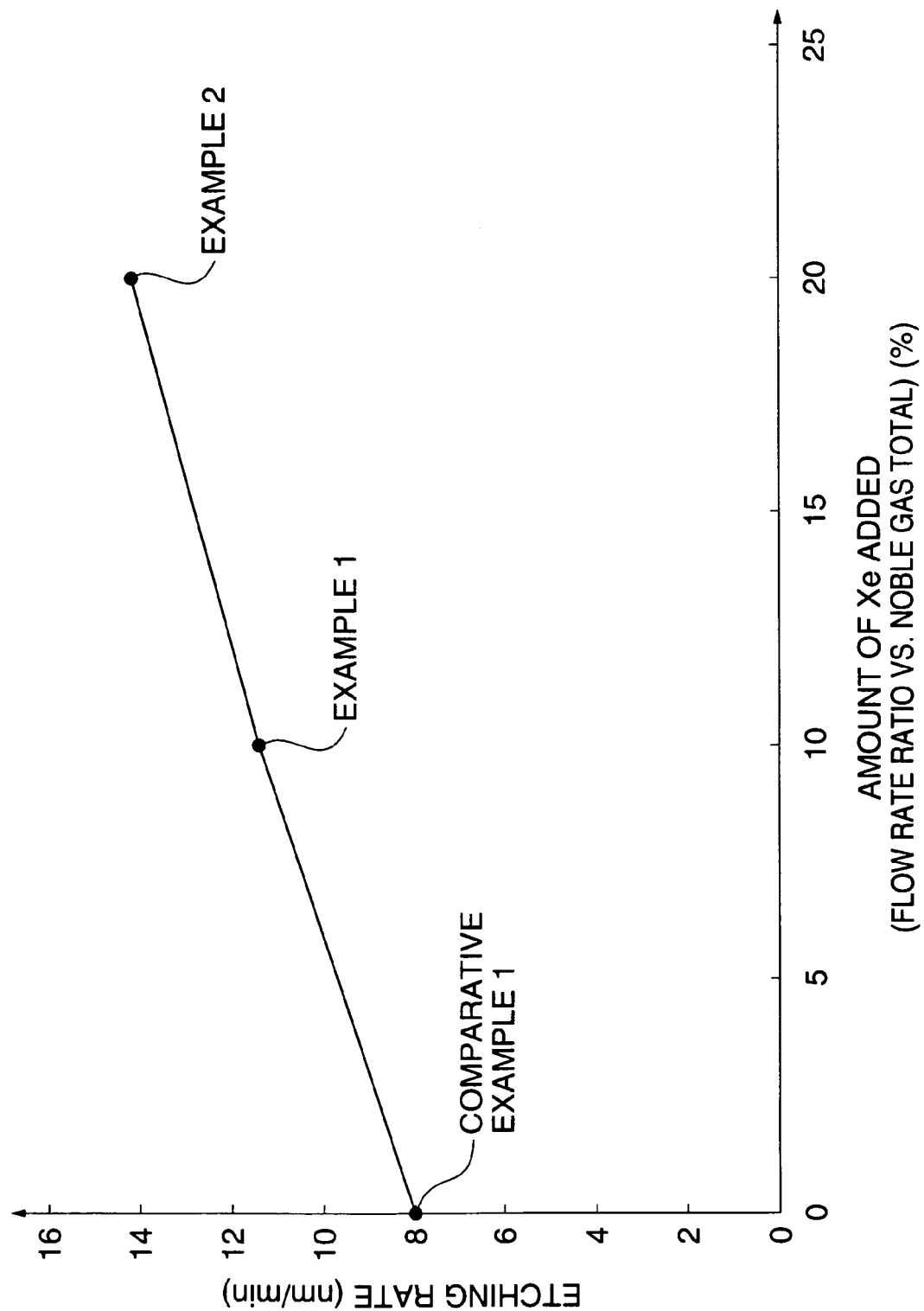
FIG. 2 is a graph showing changes in the etching rate for hafnium oxide upon changing the amount of xenon gas added to a processing gas comprised of $C_4F_8$ gas, carbon monoxide gas and argon gas.

From the graph in FIG. 2, it can be seen that whereas the etching rate was approximately 8 nm/min for Comparative Example 1, the etching rate was approximately 11 nm/min for Example 1 and approximately 14 nm/min for Example 2. It can thus be seen that the etching rate can be increased by adding xenon gas. Moreover, as a result of comparing the surface forms in FIGS. 3A and 3B, it can be seen that needle-like projections on an $SiO_2$ layer, which arise in the case of not adding xenon gas (Comparative Example 1), can be prevented from arising by adding xenon gas (Example 2). The ability to dissociate a halogen compound to produce the halogen is greater for xenon than for argon, and hence it is thought that the above effects are due to dissociation of the $C_4F_8$ to produce fluorine being promoted more in Examples 1 and 2 than in Comparative Example 1.

Example 3

First, a hafnium oxide film blanket wafer, a silicon nitride film blanket wafer, and an $SiO_2$ film blanket wafer were prepared as wafers to be etched. Next, each of the wafers in turn was transferred into the chamber 11 of the plasma processing apparatus 10, and a mixture of argon gas, xenon gas and hydrogen gas at flow rates of 180, 420 and 4 sccm respectively was supplied into the processing space S in the chamber 11 as a processing gas. Next, high-frequency electrical power was applied into the processing space S, thus producing a plasma from the processing gas, and hence etching the wafer. The etching rate was measured during the etching. The measured etching rates are shown on a graph in FIG. 4. Moreover, the etching selectivity ratio for the hafnium oxide film versus the silicon nitride film, and the etching selectivity ratio for the hafnium oxide film versus the $SiO_2$ film are shown on a graph in FIG. 5.

Example 4

First, a hafnium oxide film blanket wafer, a silicon nitride film blanket wafer, and an $SiO_2$ film blanket wafer were prepared as in Example 3. Next, each of the wafers was etched using the same method as in Example 3. Here, a mixture of argon gas, xenon gas and hydrogen gas at flow rates of 180, 420 and 8 sccm respectively was supplied into the processing space S. The measured etching rates are shown on the graph in FIG. 4, and the etching selectivity ratio for the hafnium oxide film versus the silicon nitride film, and the etching selectivity ratio for the hafnium oxide film versus the $SiO_2$ film are shown on the graph in FIG. 5.

Example 5

First, a hafnium oxide film blanket wafer and a silicon nitride film blanket wafer were prepared. Next, each of the wafers was etched using the same method as in Example 3. Here, a mixture of argon gas, xenon gas and hydrogen gas at flow rates of 180, 420 and 16 sccm respectively was supplied into the processing space S. The measured etching rates are shown on the graph in FIG. 4, and the etching selectivity ratio for the hafnium oxide film versus the silicon nitride film is shown on the graph in FIG. 5.

Comparative Example 2

First, a hafnium oxide film blanket wafer, a silicon nitride film blanket wafer, and an $SiO_2$ film blanket wafer were prepared as in Example 3. Next, each of the wafers was etched using the same method as in Example 3. Here, a mixture of argon gas and xenon gas at flow rates of 180 and 420 sccm respectively was supplied into the processing space S. The measured etching rates are shown on the graph in FIG. 4, and the etching selectivity ratio for the hafnium oxide film versus the silicon nitride film, and the etching selectivity ratio for the hafnium oxide film versus the $SiO_2$ film are shown on the graph in FIG. 5.

Figure 4:
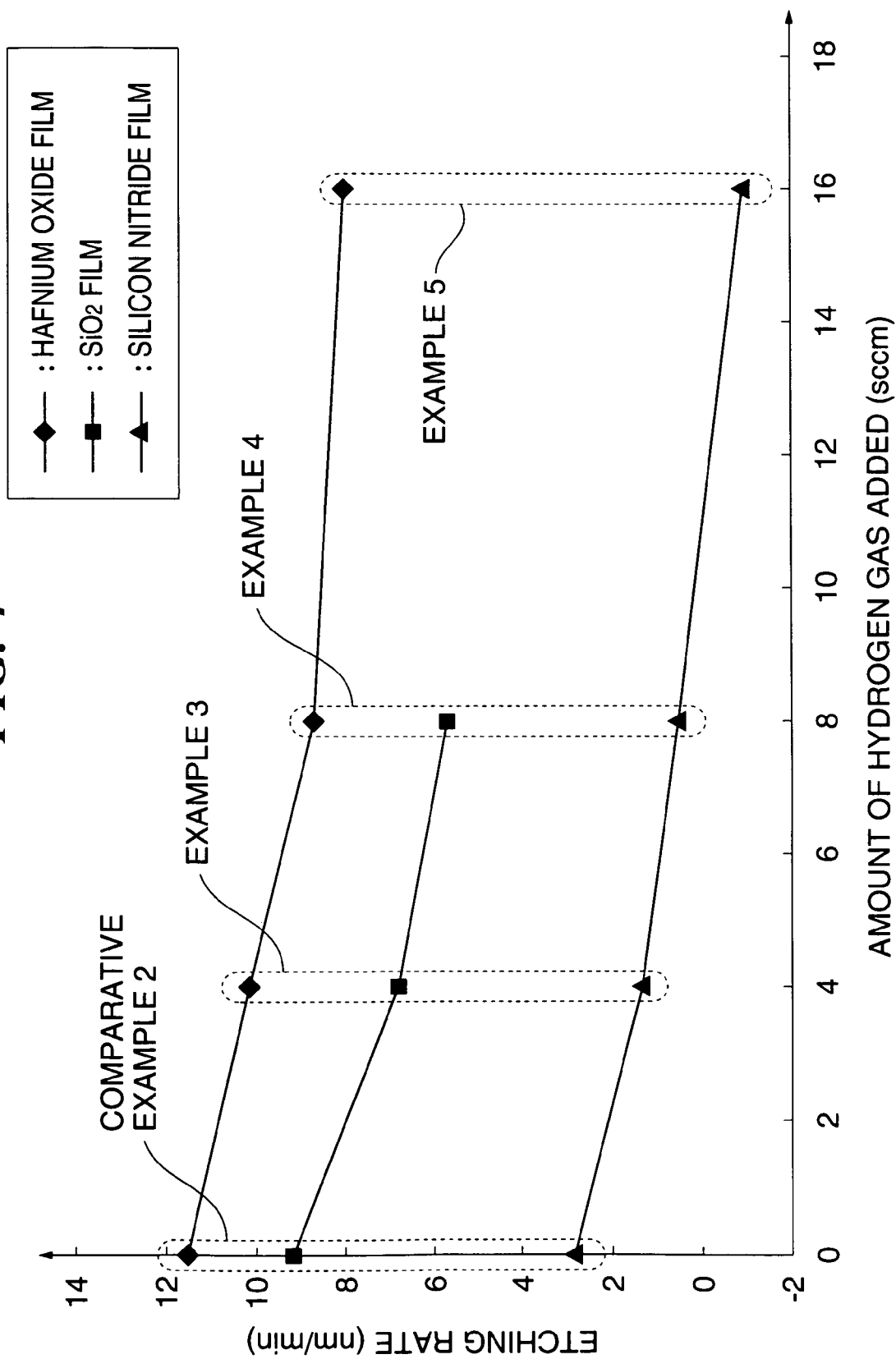
FIG. 4 is a graph showing changes in the etching rates for a hafnium oxide film, a silicon nitride film and an $SiO_2$ film upon changing the amount of hydrogen gas added to a processing gas comprised of argon gas and xenon gas.

For above Examples 3 to 5 and Comparative Example 2, on the graph in FIG. 4, the hafnium oxide film etching rate is indicated by "♦", the $SiO_2$ film etching rate is indicated by "■", and the silicon nitride film etching rate is indicated by "▲". Moreover, on the graph in FIG. 5, the etching selectivity ratio for the hafnium oxide film versus the silicon nitride film is indicated by "▲", and the etching selectivity ratio for the hafnium oxide film versus the $SiO_2$ film is indicated by "■".

From the graph in FIG. 4, it can be seen that the etching rates for all of the hafnium oxide film, the silicon nitride film and the $SiO_2$ film decrease as the amount of hydrogen gas added is increased. It is thought that this is because the etching rate for etching of each of the hafnium oxide film, the silicon nitride film and the $SiO_2$ film by a plasma of the argon and a plasma of the xenon decreases due to an effect of etching by physical sputtering being inhibited by a plasma of the hydrogen. Furthermore, it can be seen that the extent of the decrease in the etching rate with the amount of hydrogen gas added is approximately the same for all of the hafnium oxide film, the silicon nitride film and the $SiO_2$ film.

Figure 5:
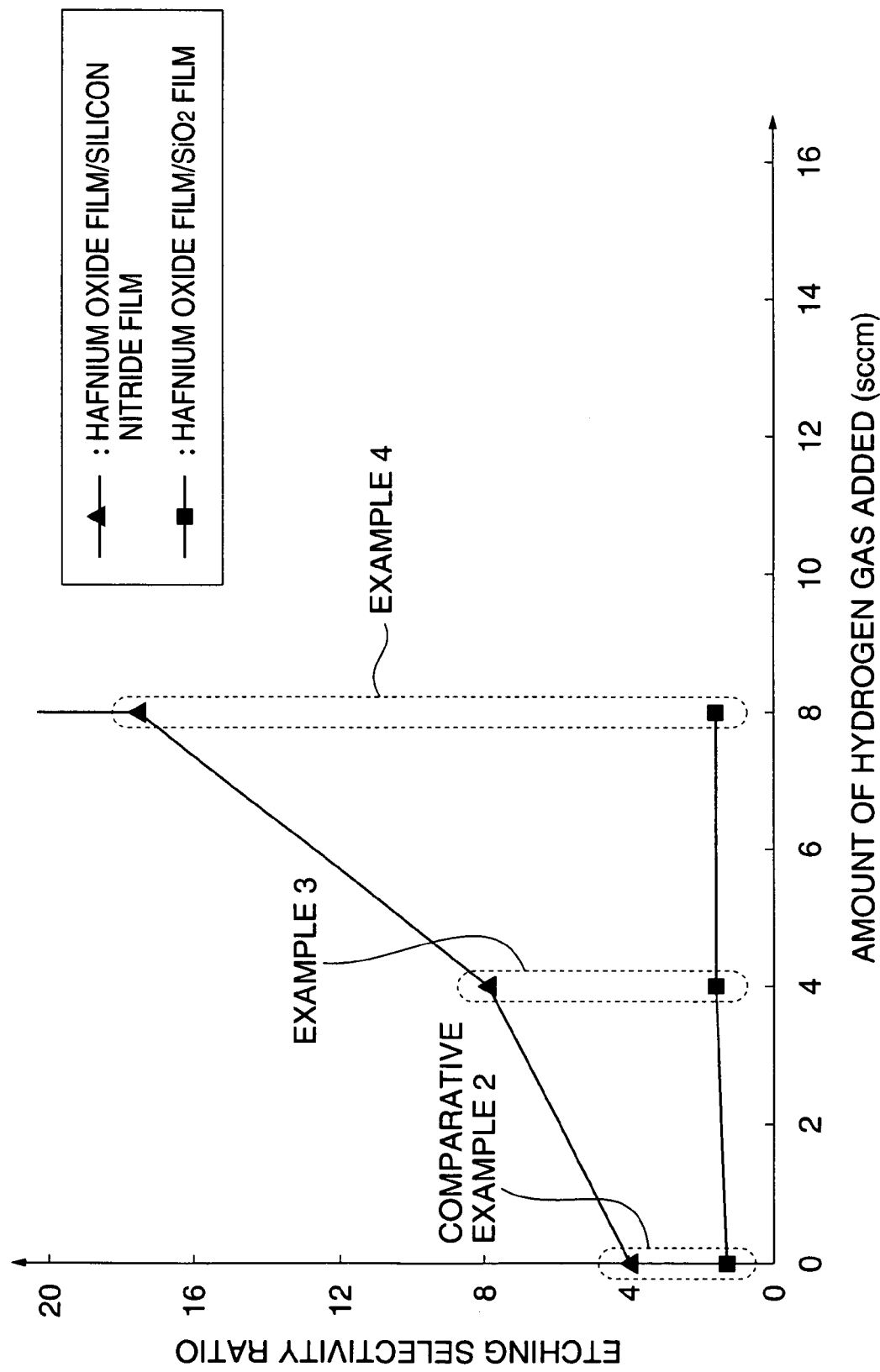
FIG. 5 is a graph showing changes in the etching selectivity ratio for a hafnium oxide film versus a silicon nitride film, and the etching selectivity ratio for the hafnium oxide film versus an $SiO_2$ film, upon changing the amount of hydrogen gas added to a processing gas comprised of argon gas and xenon gas.

Moreover, from the graph in FIG. 5, it can be seen that as the amount of hydrogen gas added is increased, the etching selectivity ratio for the hafnium oxide film versus the $SiO_2$ film hardly changes, whereas the etching selectivity ratio for the hafnium oxide film versus the silicon nitride film increases. It is thought that this is because the extent of the decrease in the etching rate with the amount of hydrogen gas added is approximately the same for the hafnium oxide film and the silicon nitride film, whereas because the etching rate for the silicon nitride film is originally lower than the etching rate for the hafnium oxide film, the etching of the silicon nitride film stops upon a certain amount of hydrogen gas being added.

What is claimed is:

1. A method of making a semiconductor device comprising subjecting a substrate having a high-dielectric-constant gate insulating film and a hard mask comprising silicon nitride formed thereon to etching processing using a plasma of a processing gas, wherein said processing gas contains a noble gas and a reducing gas, and wherein said reducing gas comprises at least hydrogen gas.

2. A method of making a semiconductor device as claimed in claim 1, wherein said noble gas comprises at least one selected from the group consisting of helium gas, neon gas, argon gas, krypton gas, and xenon gas.

3. A method of making a semiconductor device as claimed in claim 1, wherein said reducing gas further comprises at least one selected from the group consisting of, carbon monoxide gas, and methane gas.

4. A method of making a semiconductor device as claimed in claim 1, wherein in said processing gas, a flow rate ratio of said hydrogen gas to said noble gas is not less than 4/600.

5. A method of making a semiconductor device as claimed in claim 4, wherein in said processing gas, a flow rate ratio of said hydrogen gas to said noble gas is not less than 8/600.

6. A method of making a semiconductor device as claimed in claim 5, wherein in said processing gas, a flow rate ratio of said hydrogen gas to said noble gas is not less than 16/600.

* * * * *

UNITED STATES PATENT AND TRADEMARK OFFICE
CERTIFICATE OF CORRECTION

PATENT NO.         : 7,405,160 B2
APPLICATION NO. : 11/299690
DATED              : July 29, 2008
INVENTOR(S)        : Kozuka et al.

It is certified that error appears in the above-identified patent and that said Letters Patent is hereby corrected as shown below:

On the title page, Item (75), the second inventor's city of residence is incorrect. Item (75) should read:

Item -- (75)   Inventors:   Shinichi Kozuka, Nirasaki (JP);
                            Naoto Umehara, Oregon (US) --

Signed and Sealed this

Thirtieth Day of September, 2008

JON W. DUDAS
*Director of the United States Patent and Trademark Office*